United States Patent
Wang et al.

(10) Patent No.: US 7,313,743 B2
(45) Date of Patent: Dec. 25, 2007

(54) HYBRID SCAN-BASED DELAY TESTING TECHNIQUE FOR COMPACT AND HIGH FAULT COVERAGE TEST SET

(75) Inventors: Seongmoon Wang, Plainsboro, NJ (US); Xiao Liu, Blackburg, VA (US); Srimat T. Chakradhar, Manalapan, NJ (US)

(73) Assignee: NEC Laboratories America, Inc, Princeton, NJ (US)

( * ) Notice: Subject to any disclaimer, the term of this patent is extended or adjusted under 35 U.S.C. 154(b) by 383 days.

(21) Appl. No.: 10/653,959

(22) Filed: Sep. 4, 2003

(65) Prior Publication Data

US 2005/0066242 A1    Mar. 24, 2005

(51) Int. Cl.
G01R 31/317    (2006.01)
G01R 31/316    (2006.01)
(52) U.S. Cl. .................................. 714/726; 714/729
(58) Field of Classification Search ................. 714/726, 714/729, 733, 25, 727; 713/193
See application file for complete search history.

(56) References Cited

U.S. PATENT DOCUMENTS 5,357,572 A * 10/1994 Bianco et al. .............. 713/193
5,675,589 A * 10/1997 Yee .............................. 714/30
5,774,474 A * 6/1998 Narayanan et al. ......... 714/726
2004/0177299 A1 * 9/2004 Wang et al. ................ 714/726

OTHER PUBLICATIONS

D. Belete, A. Razdan, W. Schwarz, R. Raina, C. Hawkins, and J.Morehead. Use of DFT Techniques In Speed Grading a 1GHz+ Microprocessor. In Proceedings IEEE International Test Conference, pp. 1111-1119, 2002.
J. L. Carter, V. S. Iyengar, and B. K. Rosen. Efficient Test Coverage Determination for Delay Faults. In Proceedings IEEE International Test Conference, pp. 418-427, 1987.
J.-S. Chang and C.-S. Lin. Test Set Compaction for Combinational Circuits. In IEEE Trans. on Computer-Aided Design of Integrated Circuit and System, vol. 14(11):1370-1378, Nov. 1995.
S. Comen. DFT-focused chip testers: What can they really do? In Proceedings IEEE International Test Conference, p. 1120, 2000.
B. Dervisoglu and G. Stong. Design for Testability: Using Scanpath Techniques for Path-Delay Test and Measurement. In Proceedings IEEE International Test Conference, pp. 365-374, 1991.
P. Goel. An Implicit Enumeration Algorithm to Generate Tests for Combinational Logic Circuits}. In IEEE Tranactions. on Computers, vol. C-30(3), Mar. 1981.
P. Goel and B.C. Rosales. Test Generation & Dynamic Compaction of Tests. In Dig. Papers Test Conference, pp. 182-192, 1979.

(Continued)

Primary Examiner—Cynthia Britt
Assistant Examiner—Dipakkumar Gandhi
(74) Attorney, Agent, or Firm—Sughrue Mion Pllc.

(57) ABSTRACT

A scan-based method for testing delay faults in a circuit comprising controlling a subset of state inputs of the circuit by a skewed-load approach and controlling all inputs other than said subset of state inputs by a broad-side approach.

15 Claims, 8 Drawing Sheets

OTHER PUBLICATIONS

L. H. Goldstein and E. L. Thigpen. SCOAP: Sandia Controllability/Observability Analysis Program. In Proceedings IEEE-ACM Design Automation Conference, pp. 190-196; 1980.

K. Heragu, J. H. Patel, and V. D. Agrawal. SIGMA: A Simulator for Segment Delay Faults. In Proceedings IEEE International Conference on Computer-Aided Design, pp. 502-508, 1996.

A. K. Pramanick and S. M. Reddy. On the Fault Coverage of Gate Delay Fault Detecting Tests. IEEE Trans. on Computer-Aided Design of Integrated Circuit and System, vol. 16(1):78-94, Jan. 1997.

I. Pomeranz, L. N. Reddy, and S. M. Reddy. COMPACTEST: A Method to Generate Compact Test Sets for Combinational Circuits. In Proceedings IEEE International Test Conference, pp. 194-203, 1991.

G. D. Robinson. DFT-focused chip testers: What can they really do? In Proceedings IEEE International Test Conference, pp. 1119, 2000.

J. Savir. Skewed-Load Transition Test: Part I, Calculus. In Proceedings IEEE International Test Conference, pp. 705-713, 1992.

J. Savir. Broad-side Delay Test. In IEEE Trans. on Computer-Aided Design of Integrated Circuit and System, vol. 13(8):1057-1064, Aug. 1994.

J. Savir and R. Berry. At-Speed Test is not Necessarily an AC Test. In Proceedings IEEE International Test Conference, pp. 722-728, 1991.

J. Saxena, K. M. Butler, J. Gatt, R. R, S. P. Kumar, S. Basu, D. J. Campbell, and J. Berech. Scan-Based Transition Fault Testing—Implementation and Low Cost Test Challenges. In Proceedings IEEE International Test Conference, pp. 1120-1129, 2002.

G. L. Smith. Model for Delay Faults Based Upon Paths. In Proceedings IEEE International Test Conference, pp. 342-349, 1985.

J. Savir and S. Patil. Scan-Based Transition Test. IEEE Trans. on Computer-Aided Design of Integrated Circuit and System, vol. 12(8), Aug. 1993.

J. Savir and S. Patil. Broad-Side Delay Test. IEEE Trans. on Computer-Aided Design of Integrated Circuit and System, vol. 13(8), Aug. 1994.

S. Wang and S. T. Chakradhar. A Scalable Scan-Path Test Point Insertion Technique to Enhance Delay Fault Coverage for Standard Scan Designs. To appear in Proceedings IEEE International Test Conference, 2003.

J. A. Waicukauski, E. Lindbloom, B. K. Rosen, and V. S. Iyengar. Transition Fault Simulation. IEEE Design & Test of Computers, pp. 32-38, Apr. 1987.

* cited by examiner

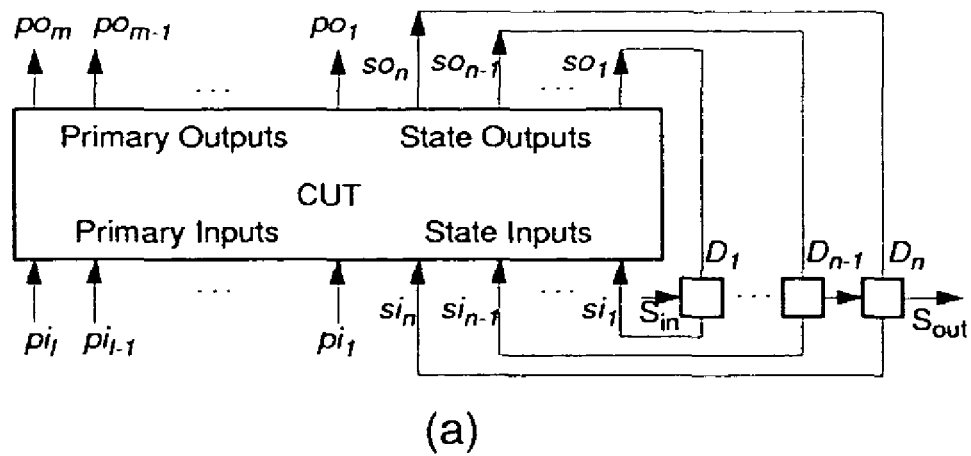
(a)
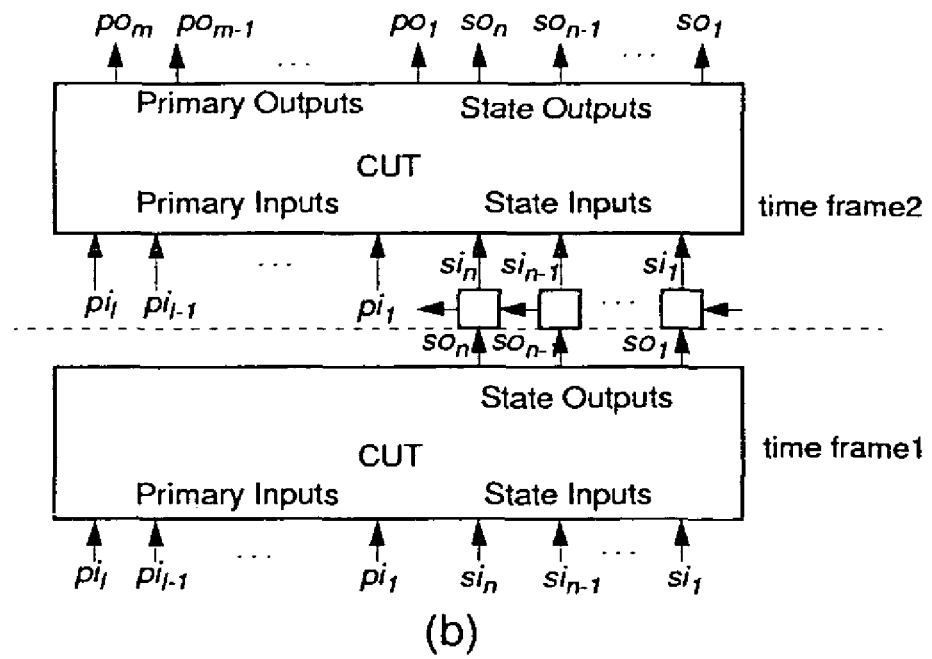
(b)
Figure 1

Selecting skewed-load scan flip-flops compute $C1(l)$ and $C0(l)$ for every line $l$ in the circuit;
for every state output $so_i$;
    $cost(so_i) = \max(C1(so_i), C0(so_i))$;
end for;
for every state input $si_i$;
    compute shift dependency relation with $si_{i-1}$;
end for;
sort state outputs $so_i$ by $cost(so_i)$, in non-increasing order
$j = 1$;
for $i = 1$ to $n$; /* $n$ is the number of state inputs in the circuit */
    if $si_i$ is indepdent of $si_{i-1}$, then
    select corresponding flip-flop $D_i$ as a skewed-load flip-flop
    and increment $j$ by 1;
      if $(j > M)$ then exit the for loop;
end for;

Figure 5

Table 1: Experimental Results

| CKT | | Skewed-load | | | Broad-side | | | Hybrid | | | |
|---|---|---|---|---|---|---|---|---|---|---|---|
| Name | # FFs | % FC | # Vec. | time | % FC | # Vec. | time | # SFFs | % FC | # Vec. | time |
| s208 | 8 | 83.43 | 41 | 0.13s | 69.23 | 28 | 0.29s | 1 | 73.96 | 33 | 0.13s |
| s298 | 14 | 78.79 | 30 | 0.13s | 79.17 | 30 | 0.39s | 2 | 87.12 | 48 | 0.22s |
| s344 | 15 | 92.13 | 37 | 0.15s | 92.88 | 36 | 0.35s | 1 | 96.63 | 46 | 0.18s |
| s349 | 15 | 92.31 | 38 | 0.15s | 93.04 | 42 | 0.42s | 1 | 96.70 | 48 | 0.14s |
| s386 | 6 | 88.44 | 76 | 0.25s | 66.33 | 47 | 0.89s | 1 | 80.27 | 63 | 0.72s |
| s420 | 16 | 82.35 | 80 | 0.59s | 68.24 | 53 | 1.32s | 1 | 70.00 | 56 | 0.60s |
| s444 | 21 | 87.70 | 38 | 0.22s | 77.01 | 42 | 1.32s | 3 | 79.14 | 47 | 1.26s |
| s510 | 6 | 86.85 | 80 | 0.60s | 84.13 | 79 | 2.26s | 1 | 93.88 | 88 | 1.25s |
| s526 | 21 | 83.30 | 70 | 0.46s | 60.89 | 58 | 2.11s | 3 | 68.92 | 70 | 2.05s |
| s641 | 19 | 99.49 | 57 | 0.60s | 95.67 | 83 | 9.33s | 2 | 96.44 | 78 | 16.46s |
| s713 | 19 | 99.56 | 66 | 0.79s | 94.32 | 91 | 17.20s | 2 | 94.98 | 76 | 38.11s |
| s820 | 5 | 84.62 | 131 | 1.67s | 77.49 | 133 | 10.46s | 1 | 85.04 | 138 | 21.05s |
| s832 | 5 | 84.52 | 141 | 1.70s | 77.13 | 135 | 11.43s | 1 | 84.94 | 148 | 21.89s |
| s838 | 32 | 81.71 | 152 | 3.08s | 67.55 | 104 | 6.73s | 1 | 68.44 | 108 | 2.93s |
| s953 | 29 | 91.94 | 133 | 2.30s | 92.43 | 134 | 6.49s | 3 | 95.85 | 135 | 6.36s |
| s1196 | 18 | 99.91 | 227 | 4.72s | 99.81 | 237 | 8.06s | 2 | 99.81 | 217 | 2.36s |
| s1238 | 36 | 99.91 | 232 | 7.58s | 99.72 | 233 | 12.10s | 2 | 99.72 | 231 | 5.61s |
| s1423 | 74 | 95.41 | 113 | 12.44s | 87.73 | 134 | 9m23s | 8 | 88.48 | 129 | 14m7s |
| s1488 | 6 | 76.22 | 145 | 4.31s | 85.59 | 151 | 24.13s | 1 | 91.80 | 171 | 21.8s |
| s1494 | 6 | 75.88 | 145 | 4.25s | 85.51 | 147 | 24.00s | 1 | 91.81 | 170 | 22.45s |
| s5378 | 179 | 92.22 | 336 | 47.34s | 93.02 | 365 | 9m2s | 18 | 94.76 | 349 | 22m40s |
| s9234 | 228 | 91.89 | 605 | 12m50s | 83.01 | 643 | 83m21s | 23 | 84.98 | 598 | 126m27s |
| s13207 | 669 | 88.27 | 654 | 8m48s | 77.74 | 620 | 24m48s | 67 | 89.52 | 803 | 17m5s |
| s15850 | 597 | 92.53 | 595 | 22m6s | 66.17 | 508 | 113m16s | 60 | 72.56 | 524 | 166m1s |
| s35932 | 1728 | 100.0 | 125 | 7m11s | 93.80 | 131 | 11m58s | 173 | 99.58 | 175 | 6m40s |
| s38417 | 1636 | 98.57 | 1705 | 136m26s | 96.80 | 1566 | 226m23s | 164 | 96.84 | 1669 | 505m33s |
| s38584 | 1452 | 92.48 | 1097 | 82m15s | 90.21 | 1463 | 759m47s | 146 | 93.20 | 1528 | 898m31s |

HYBRID SCAN-BASED DELAY TESTING TECHNIQUE FOR COMPACT AND HIGH FAULT COVERAGE TEST SET

I. DESCRIPTION

I.A. Field

The disclosed teachings relate to a hybrid scan-based delay testing technique that provides a high fault coverage test set.

I.B. Background

1. References

The following papers provide useful background information, for which they are incorporated herein by reference in their entirety, and are selectively referred to in the remainder of this disclosure by their accompanying reference keyword in square brackets (i.e., [CL95] for the by J.-S. Chang and C.-S. Lin.):

[BRS+02] D. Belete, A. Razdan, W. Schwarz, R. Raina, C. Hawkins, and J. Morehead. Use of DFT Techniques In Speed Grading a 1 GHz+Microprocessor. In Proceedings IEEE International Test Conference, pages 1111-1119, 2002.

[CIR87] J. L. Carter, V. S. Iyengar, and B. K. Rosen. Efficient Test Coverage Determination for Delay Faults. In Proceedings IEEE International Test Conference, pages 418-427, 1987.

[CL95] J.-S. Chang and C.-S. Lin. Test Set Compaction for Combinational Circuits. In IEEE Trans. on Computer-Aided Design of Integrated Circuit and System, Vol. 14(11): 1370-1378, November 1995.

[Com00] S. Comen. DFr-focused chip testers: What can they really do? In Proceedings IEEE International Test Conference, page 1120, 2000.

[DS91] B. Dervisoglu and G. Stong. Design for Testability: Using Scanpath Techniques for Path-Delay Test and Measurement. In Proceedings IEEE International Test Conference, pages 365-374, 1991.

[Goe81] P. Goel. An Implicit Enumeration Algorithm to Generate Tests for Combinational Logic Circuits}. In IEEE Tranactions. on Computers, Vol. C-30(3), March 1981.

[GR79] P. Goel and B. C. Rosales. Test Generation & Dynamic Compaction of Tests. In Dig. Papers Test Conference, pages 182-192; 1979.

[GT80] L. H. Goldstein and E. L. Thigpen. SCOAP: Sandia Controllability/Observability Analysis Program. In Proceedings IEEE-ACM Design Automation Conference, pages 190-196, 1980.

[HPA96] K. Heragu, J. H. Patel, and V. D. Agrawal. SIGMA: A Simulator for Segment Delay Faults. In Proceedings IEEE International Conference on Computer-Aided Design, pages 502-508, 1996.

[PR97] A. K. Pramanick and S. M. Reddy. On the Fault Coverage of Gate Delay Fault Detecting Tests. IEEE Trans. on Computer-Aided Design of Integrated Circuit and System, Vol. 16(1):78-94, January 1997.

[PRR91] I. Pomeranz, L. N. Reddy, and S. M. Reddy. COMPACTEST: A Method to Generate Compact Test Sets for Combinational Circuits. In Proceedings IEEE International Test Conference, pages 194-203, 1991.

[Rob00] G. D. Robinson. DFT-focused chip testers: What can they really do? In Proceedings IEEE International Test Conference, page 1119, 2000.

[Sav92] J. Savir. Skewed-Load Transition Test: Part I, Calculus. In Proceedings IEEE International Test Conference, pages 705-713, 1992.

[Sav94] J. Savir. Broad-side Delay Test. In IEEE Trans. on Computer-Aided Design of Integrated Circuit and System, Vol. 13(8):1057-1064, August 1994.

[SB91] J. Savir and R. Berry. At-Speed Test is not Necessarily an AC Test. In Proceedings IEEE International Test Conference, pages 722-728, 1991.

[SBG+02] J. Saxena, K. M. Butler, J. Gatt, R. R, S. P. Kumar, S. Basu, D. J. Campbell, and J. Berech. Scan-Based Transition Fault Testing—Implementation and Low Cost Test Challenges. In Proceedings IEEE International Test Conference, pages 1120-1129, 2002.

[Smi85] G. L. Smith. Model for Delay Faults Based Upon Paths. In Proceedings IEEE International Test Conference, pages 342-349, 1985.

[SP93] J. Savir and S. Patil. Scan-Based Transition Test. IEEE Trans. on Computer-Aided Design of Integrated Circuit and System, Vol. 12(8), August 1993.

[SP94] J. Savir and S. Patil. Broad-Side Delay Test. IEEE Trans. on Computer-Aided Design of Integrated Circuit and System, Vol. 13(8), August 1994.

[WC03] S. Wang and S. T. Chakradhar. A Scalable Scan-Path Test Point Insertion Technique to Enhance Delay Fault Coverage for Standard Scan Designs. To appear in Proceedings IEEE International Test Conference, 2003.

[WLRI87] J. A. Waicukauski, E. Lindbloom, B. K. Rosen, and V. S. Iyengar. Transition Fault Simulation. IEEE Design & Test of Computers, pages 32-38, April 1987.

2. Introduction

An objective of traditional test development has been the attainment of high stuck at fault coverage. In other words, the test should be able to detect a substantial number of stuck at faults. With ever decreasing geometry sizes and increasing clock speeds, ascertaining correct operation of digital circuits at desired speed is becoming a necessity rather than an option to maintain product quality level. In the past, testing circuit's performance was typically accomplished with functional test patterns. However, developing functional test patterns that attain satisfactory fault coverage is unacceptable for large-scale designs due to the prohibitive development cost. Even if functional test patterns that can achieve high fault coverage are available, applying these test patterns at-speed for high speed chips requires very stringent timing accuracy, which can only be provided by very expensive automatic test equipments (ATEs).

The scan-based delay testing where test patterns are generated by an automatic test pattern generator (ATPG) on designs that involve scan chains is increasingly used as a cost efficient alternative to the at-speed functional pattern approach to test large scale chips for performance-related failures [BRS+02, SBG+02]. Design-for-testability (DFT)-focused ATEs [Com00, Rob00], which are designed and developed to lower ATE cost by considering widely used DFT features of circuits under test (CUTs) such as full and partial scan, are emerging as a strong trend in test industry.

Several delay fault models have been developed: transition delay fault, gate delay fault, path delay fault, and segment delay fault models. Among these fault models, the transition delay fault Model [WLRI87] is most widely used in industry for its simplicity.

ATPGs and fault simulators that are developed for stuck-at faults can be reused for transition delay faults with minor modifications. Unlike the path delay fault model [Smi85] where the number of target faults is often exponential, the number of transition delay faults is linear to the number of circuit lines. This eliminates the need for critical path analysis and identification procedures, which are necessary for the path delay fault model. Gate delay model [CIR87, PR97] is similar to transition delay fault model in that the delay fault is lumped at one gate in the CUT. However, unlike transition delay model which does not take into account fault sizes, gate delay model takes into account fault sizes. Segment delay fault model [HPA96] is a trade-off between path delay fault and transition delay fault models.

Detecting a delay fault normally requires the application of a pair of test patterns: the first pattern, called initialization pattern, initializes the targeted faulty circuit line to a desired value and the second pattern, called launch pattern, launches a transition at the circuit line and propagates the fault effect to primary output(s) and/or scan flip-flop(s). Traditionally, two different approaches have been used to apply two-pattern tests to standard scan designs. They differ in the way of applying the second pattern of each pattern pair.

In the first approach, referred to as the skewed-load [SP93] or launch-from-shift approach, the second pattern is obtained by shifting in the first pattern. In the second approach, referred to as the broad-side [SP93, SP94] or launch-from-capture, the second pattern is obtained from the circuit response to the first pattern. For most circuits, test pattern sets generated by the skewed-load approach achieve higher fault coverage than those generated by the broad-side approach [Sav94]. Sizes of test pattern sets generated by the skewed-load approach are also typically smaller than those generated by the broad-side approach [SBG+02]. However, the skewed-load approach requires higher hardware overhead and may require longer design time.

3. Definitions and Notations

FIG. 1(a) describes the Huffman model of a sequential CUT, which employs full scan, has/primary inputs, $pi_1$, $pi_2, \ldots, pi_l$, m primary outputs, $po_1$, $po_2, \ldots, po_m$, n state inputs, $si_1$, $si_2, \ldots si_n$, and also n state outputs, $so_1$, $so_2, \ldots, so_n$. Each pair of state output $so_i$ and state input $si_i$ where i=1, 2, . . . , n are connected through a scan flip-flop $D_i$ to constitute a feedback loop. The scan flip-flops are controlled by a scan enable signal to configure them into either their shift mode or normal mode. It is assumed that the scan chain is constructed with multiplexed scan type flip-flops. A multiplexed type scan flip-flop consists of a regular flip-flop and a multiplexer whose output is connected to the input of the regular flip-flop. The select input of the multiplexer selects between the normal data input and the scan input. When the normal data input is selected, the scan flip-flop is configured into its normal mode and when the scan input is selected, the scan flip-flop is configured into its shift mode.

When the circuit employs full scan, test pattern pairs for transition delay faults can be generated by running a combinational ATPG for a two time frame version of the circuit.

A two time frame version of the original circuit shown in FIG. 1(a) is shown in FIG. 1(b) where the state outputs of the first time frame copy are connected to the state inputs of the second time frame copy, i.e., state outputs $so_i$, where i=1, 2, . . . , n of the first time frame copy are connected to state inputs $si_i$ of the second time frame copy.

The scan chain input of the scan chain is connected to the scan input of scan flip-flop $D_1$ and the scan output of $D_1$ is connected to the scan input of $D_2$ and so on, and finally the scan output of $D_n$ is connected to the scan chain output. Hence, when the scan chain is in the shift mode, the value at state input $si_i$ of the second time frame is the same as the value at state input $si_{i-1}$ of the first time frame. Unlike state inputs, we assume that primary inputs are fully controllable, i.e., a completely independent pattern pair can be applied to primary inputs at any two consecutive test cycles.

4. Background Information on Scan-based Testing

Although delay fault testing has been researched for years, most researches on delay fault testing have focused on combinational circuits. However, due to limited controllability of state inputs when standard scan is employed, applying these techniques to standard scan designs is not straightforward. Test procedures of the two traditional approaches to apply test pattern pairs to standard scan designs are illustrated in the timing diagrams shown in FIG. 2. In both skewed-load and broad-side approaches, the initialization pattern of a test pattern pair is first loaded into the scan chain by n consecutive scan shift operations, where n is the number of scan flip-flops in the scan chain, in the same fashion as a stuck-at test pattern is loaded into the scan chain. The last shift cycle when a test pattern is fully loaded into the scan chain CUT is referred as the initialization cycle (see FIGS. 2(a) and (b)). The clock speed during scan shift operations is typically lower than the full system clock speed. The launch pattern is applied after the CUT is stabilized from switching caused by applying the initialization pattern. The response to the launch pattern is captured into scan flip-flops at the next clock cycle. Note that unlike the launch clock after the initialization clock, the capture clock is applied at the full system clock speed after the launch clock.

The second pattern is derived from the first pattern in both approaches. In the skewed-load approach [SP93] the second pattern is obtained by shifting in the first pattern (initialization pattern), which is loaded into the scan chain, by one more scan flip-flop and scanning in a new value into the scan chain input. Note that the scan enable signal stays at logic high during the launch cycle in the timing diagram shown in FIG. 2(a).

At the next clock cycle (capture cycle), the scan enable signal switches to logic low and the scan flip-flops in the scan chain are configured in to their normal mode to capture the response to the scanned in test pattern. Since the capture clock is applied at the full system clock speed after the launch clock, the scan enable signal, which typically drives all scan flip-flops in the CUT, should also switch within the full system clock cycle. This requires the scan enable signal to be driven by a sophisticated buffer tree or strong clock buffer. Such design requirement is often too costly to meet. Furthermore, meeting such a strict timing required for the scan enable signal may result in longer design time.

Since the second pattern of each pattern pair is obtained by shifting in the first pattern by one more scan flip-flop, given a first pattern, there are only two possible patterns for the second pattern that differ only at the value for the first scan flip-flop whose scan input is connected to the scan chain input. This shift dependency restricts the number of combinations of test pattern pairs to $2^n \times 2$[SB91] in standard scan environment, where n is the number of scan flip-flops in the scan chain. If there is a transition delay fault that requires a 1 at state input $si_{i-1}$ in an initialization pattern and requires a 0 at state input $si_i$ in the corresponding launch pattern to be detected, then that fault is untestable by the skewed-load approach (assume that the scan chain is constructed by using only non-inverting outputs of scan flip-flops).

In the broad-side approach, the second pattern is obtained from the circuit response to the first pattern. Hence, the scan flip-flops are configured into their normal mode by lowering the enable signal before every launch cycle (see FIG. 2(b)). Since the launch clock following the initialization clock need not be an at-speed clock, the scan enable signal does not have to switch to logic low at the full system clock speed between the initialization clock and the launch clock. Note that in the broad-side approach, launch patterns are applied when scan flip-flops are in their normal mode. In other words, the at-speed clock, the capture clock after the launch, is applied to scan flip-flops while the scan flip-flops stay in their normal mode. Hence, the scan enable signal does not have to switch between the launch cycle and the capture cycle. Therefore, the broad-side approach does not require at-speed transition of the scan enable signal and can be implemented with low hardware overhead.

Even though the broad-side approach is cheaper to implement than the skewed-load approach, fault coverage achieved by test pattern sets generated by the broad-side approach is typically lower than that achieved by test pattern sets generated by the skewed-load approach [SP94]. Test pattern sets generated by the broad-side approach are typically larger than those generated by the skewed-load approach [SPG+02]. In order to generate two pattern tests for the broad-side approach, an ATPG with sequential property that considers two full time frames is required. On the other hand, test patterns for the skewed-load approach can be generated by a combinational ATPG with little modification. Hence, higher test generation cost (longer test generation time) should be paid for the broad-side approach.

Since in the broad-side approach, the second pattern is given by the circuit response to the first pattern, unless the circuit can switch to all $2^n$ states, where n is the number of scan flip-flops, the number of possible patterns that can be applied as second patterns of test pattern pairs is limited. Hence, if a state required to activate and propagate a fault is an invalid state, i.e., the state cannot be functionally justified, then the transition delay fault is untestable. Typically, in large circuits that have a large number of flip-flops, the number of reachable states is only a small fraction of $2^n$ states. Due to this reason, transition fault coverage for standard scan designs is often substantially lower than stuck-at fault coverage.

Enhanced scan testing [DS91] allows the application of any arbitrary pattern pair to the combinational part of a sequential circuit. Hence, complete fault coverage can be attained. However, since this technique requires enhanced scan cells, which can hold two bits, the disadvantage of enhanced scan testing is high area overhead of enhanced scan cells. In this disclosure, faults that are not testable under standard scan environment but testable under full enhanced scan environment are referred to as dependency untestable faults. Particularly, dependency untestable faults that are not testable due to shift dependency, which may exist when the skewed-load approach is used, are referred as shift dependency untestable faults and dependency untestable faults that are not testable due to function dependency, which may exist when the broad-side approach is used, are referred as function dependency untestable faults.

As described above, although the skewed-load approach has several advantages (higher fault coverage, smaller test pattern sets, and ease of test generation) over the broad-side approach, the broad-side approach is the only choice of scan-based test method in many cases due to difficulty meeting design requirements of the skewed-load approach [SBG+02]. However, using the broad-side approach to avoid high hardware overhead will incur significantly higher test application cost and result in lower test quality for most designs than using the skewed-load approach.

The cost of test application is directly determined by the size of test pattern set to be applied. As sizes and complexity of chips grow, size of test pattern sets also tend to grow. Hence, generating compact test pattern sets is a very important objective of test developers. Due to large test volume required to achieve satisfactory coverage, transition fault coverage is often compromised for acceptable test volume. In most compaction algorithms, don't cares in test patterns, which are not assigned binary values, play an important role in compacting test pattern sets. Test compaction techniques can be classified as Dynamic [GR79, PRR91] and static Compaction [GR79, CL95] according to when compaction of test patterns is performed. In dynamic compaction, which performed during test generation, don't cares, which are not specified in a pattern generated to detect a fault, are specified to detect more faults. Test patterns that have many don't cares can be easily merged together by a static compaction technique, which is performed on pre-generated test patterns as a post-processing step, to reduce the number of patterns in the final test pattern set.

5. Illustrative Example

FIG. 3 illustrates backtrace operations during a test generation process to generate test pattern pairs for a delay fault. Suppose that it is desired to generate a test pattern pair for the slow-to-rise (STR) fault at line l. Assume that state input $si_i$ should be assigned a 1 to activate the fault and propagate the activated fault effect to observation point(s) (primary and scan outputs). If the broad-side approach is used a large number of state inputs need to be specified in time frame 1 to set $si_i$ to a 1 in time frame 2. On the other hand, if the skewed-load approach is used, assigning a 1 to $si_i$ in time frame 2 is achieved by setting only $si_{i-1}$ to a 1 in time frame 1 (see FIG. 3(b)) and no backtrace is required in time frame 1. Hence, test patterns generated by the skewed-load approach typically have more don't cares, i.e. fewer specified bits, than those generated by the broad-side approach. This implies that test patterns generated by the skewed-load approach have more room for compaction. Indeed, sizes of test pattern sets generated by the skewed-load approach are typically smaller than those of test pattern sets generated by the broad-side approach [SBG+02].

II. SUMMARY

It will be advantageous to have additional approaches that combine the advantages of the broad-side approach and the skewed-load approach.

To realize the some of the advantages discussed above there is provided a scan-based method for testing delay faults in a circuit comprising controlling a subset of state inputs of the circuit by a skewed-load approach and controlling all inputs other than said subset of state inputs by a broad-side approach.

In a specific enhancement, the subset of state inputs are those state inputs that require a large number of primary and state inputs to be specified in a previous time frame so that the said state inputs can be set to required binary values in current time frame.

In another specific enhancement, the subset of state inputs are connected to outputs of scan flip-flops that are controlled by a separate scan enable signal called fast scan enable signal, and all state inputs other than said subset of state inputs are controlled by another scan enable signal called slow scan enable signal.

More specifically, only the fast scan enable signal switches in one system clock cycle (at-speed) and the slow scan enable signal does not switch at-speed.

Still more specifically, the fast scan enable signal is internally generated by on-chip circuitry.

Even more specifically, the fast scan enable signal is synchronized to the system clock.

In another specific enhancement, the subset of state inputs are selected using controllability measures.

More specifically, the fast scan enable signal drives the flip-flops corresponding to the subset of state inputs at-speed, without the need for strong buffers or buffer trees.

More specifically, the selection of the subset of state inputs can be performed by considering shift dependency relationship between adjacent flip-flops.

More specifically the set of selected scan flip-flops can be further divided into several subsets, each of which is controlled by a separate scan enable signal.

More specifically, each scan enable signal is controlled by a flip-flop such that the scan enable signal switches at-speed when the flip-flop is assigned a 1 and switches at slow speed when the corresponding flip-flop is assigned a 0.

More specifically, only the scan flip-flops whose scan enable signal switches at-speed (fast scan enable) are controlled by the skewed-load approach and the other scan flip-flops are controlled by broad-side approach.

More specifically, faults that are not detected when a subset of scan flip-flops is controlled by the skewed-load approach are detected when the same subset of scan flip-flops is controlled by the broad-side approach.

III. BRIEF DESCRIPTION OF THE DRAWINGS

The disclosed teachings will become more apparent by describing in detail examples and embodiments thereof with reference to the attached drawings in which:

FIG. 1 shows an example of a full-scan circuit (a) Original circuit (b) Two frame version.

FIG. 5 shows an example pseudo-code for skewed-load flip-flop selection algorithm.

FIG. 8 shows a table with the results of the experiments.

IV. DETAILED DESCRIPTION

IV.A. Synopsis

A novel scan-based delay test approach that combines advantages of the skewed-load and broad-side approaches are disclosed herein. In the hybrid approach, a subset of selected scan flip-flops are controlled by the skewed-load approach and the rest of scan flip-flops are controlled by the broad-side approach. It should be noted that the disclosed techniques are applicable to other delay fault models. For simplicity and ease of understanding, transition delay fault model is used as an example to illustrate the concepts of the disclosed teachings.

IV.B. Illustrative Example

Switching the scan enable signal that drives all scan flip-flops in a large circuit within one full system clock cycle requires a strong clock buffer or a buffer tree. But a scan enable signal that drives only a small number of flip-flops (say, 100 flip-flops) can switch in one full system clock cycle without any strong buffer or buffer tree. If only a small set of state inputs of the circuit require a large number of inputs to be specified in time frame 1 to be set to binary values in time frame 2 (and the rest of state inputs can be set to binary values in time frame 2 by specifying only small numbers of inputs in the time frame 1), then controlling only those state inputs by the skewed-load approach and controlling the rest of state inputs by the broad-side approach will generate test patterns that have many don't cares in time frame 1.

Since only the small set of scan flip-flops are driven by a separate scan enable signal, the separate scan enable signal can switch in one system clock cycle without being driven by a strong buffer or a buffer tree. The scan enable signal that drives the rest of scan flip-flops, which are controlled by the broad-side approach signal, need not switch at-speed. In consequence, using a hybrid approach, one can take advantages of the skewed-load approach without having to meet costly design requirement of the traditional skewed-load approach.

In the rest of this disclosure, scan flip-flops that are controlled by the skewed-load approach are referred to as skewed-load flip-flops and flip-flops that are controlled by the broad-side approach are referred to as broad-side flip-flops.

Figure 4:
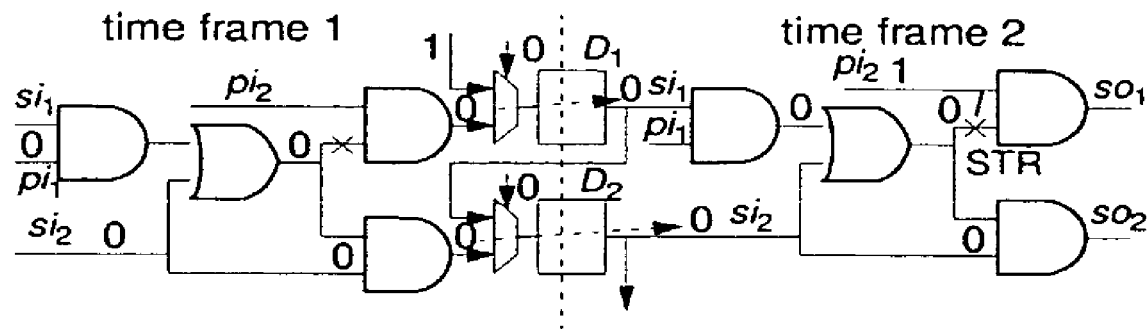
FIG. 4 shows an example of a function dependency untestable fault.

In addition some faults that are not testable by the traditional broad-side approach due to function dependency can become testable by the hybrid approach. For example, consider the STR fault at line l in the circuit shown in FIG. 4. In order to initialize the STR fault, line l should be set to a 0 in time frame 1. Assume that when the select input of multiplexer of a scan flip-flop, which selects between the scan input and the normal data input, is set to a 0, then the scan flip-flop is configured its into normal mode and the normal data input of the multiplexer is selected. Therefore, the 0 at line l in time frame 1 propagates to state input $si_1$ in time frame 2 through the AND gate at the next cycle (launch cycle). The 0 at input $si_1$ in turn propagates to line l in time frame 2. However, in order to activate the STR fault in time frame 2, line l should be set to a 1. Hence, the STR fault is not testable when the broad-side approach is used. Now, assume that scan flip-flop $D_1$ is controlled by the skewed-load approach, i.e., the select input of multiplexer of $D_1$ is set to a 1 to select the scan input. If the scan input of $D_i$ is assigned a 1, then the 1 at the scan input of $D_1$ propagates to input si1 in time frame 2 rather than the 0 at the normal data input. If both primary inputs pi1 and pi2 are assigned 1's in time frame 2, the STR fault at line l can be detected at scan output $so_1$.

Figure 2:
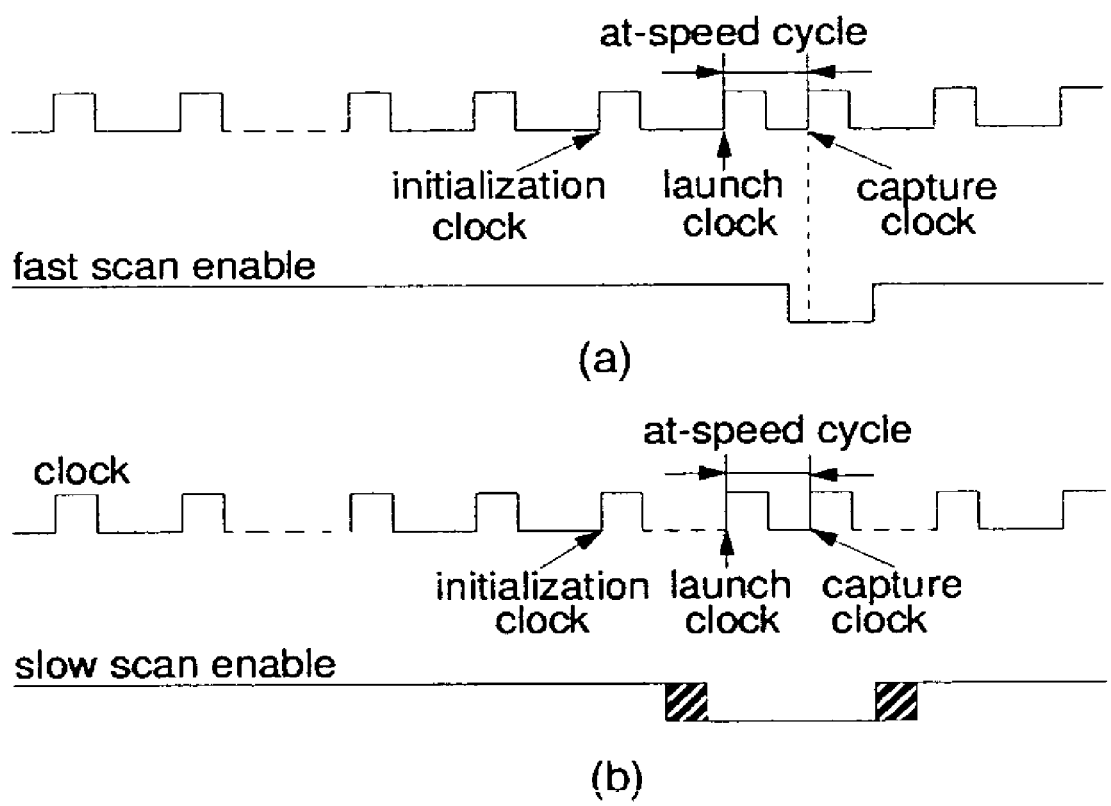
FIG. 2 shows Scan-based Delay Test Timing Diagram (a) Skewed-load approach (b) Broad-side approach.
Figure 3:
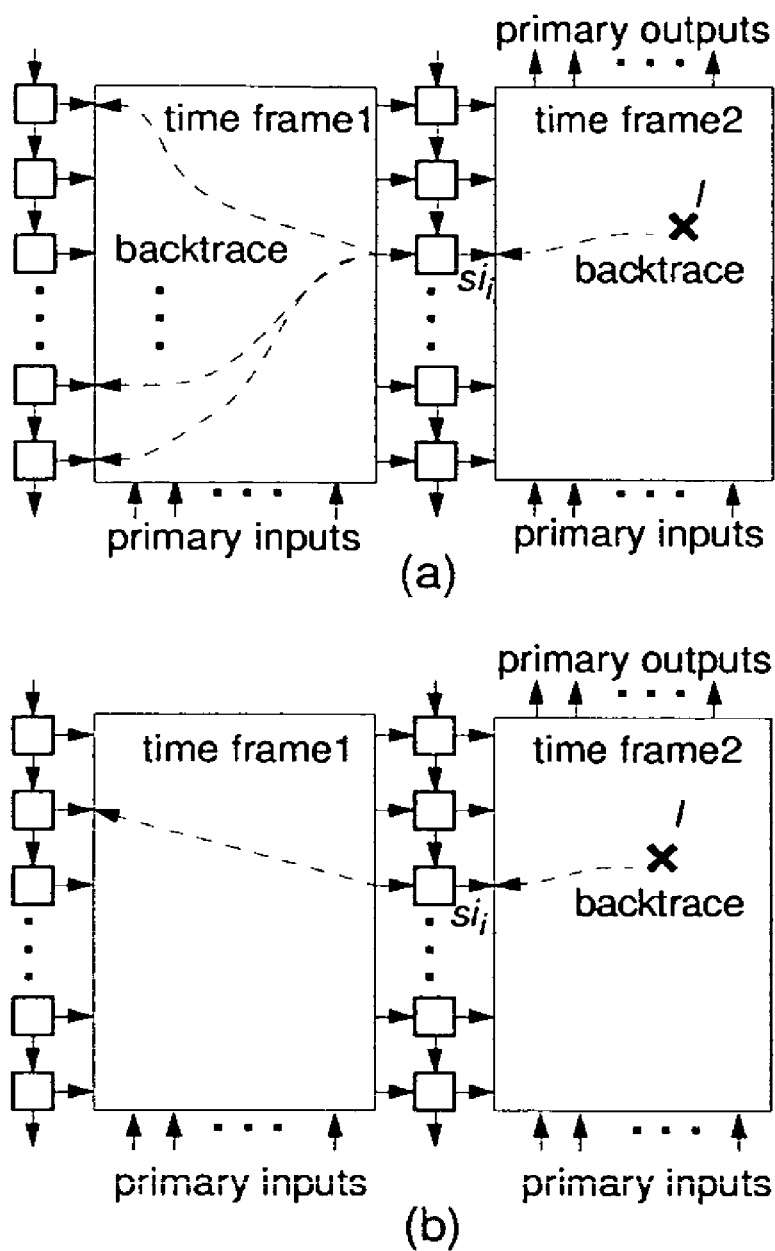
FIG. 3 shows assignment of state inputs in time frame 2 (a) Broad-side Approach (b) Skewed-load Approach.

The disclosed hybrid approach can also speed up ATPG process. Referring to the example of FIG. 3, it is assumed that state input $si_i$ should be set to a 1 in time 2 to activate the fault at line l and propagate the fault effect. When the broad-side approach is used, this may need to assign a large number of inputs (primary or state inputs) to binary values in time frame 1. If PODEM [Goe 81] algorithm is used to generate test patterns, this will be achieved by a series of backtrace operations in time frame 1. Whether setting $si_i$ to a 1 in time frame 2 leads to a solution to generate a test pattern pair for the target fault at line l cannot be determined until state $si_i$ is assigned a 1 in time frame 2. If setting $si_i$ to a 1 in time frame 2 does not lead to a solution, it is found only after a lot of CPU time has been already spent on backtrace operations and following forward implications. On the other hand, if the skewed-load approach is used, setting state input $si_i$ to a 1 can be achieved by simply setting state input $si_{i-1}$ in time frame 1 and forward implying the assignment at state input $si_{i-1}$. This requires no backtrace operations in time frame 1. If setting state input $si_i$ to a 1 in time frame 2 does not lead to a solution, then the ATPG can immediately backtrack without wasting time on a large number of backtrace operations and following forward implications.

IV.C. Selecting Skewed-Load Flip-Flops

Controllability measures, which are similar to SCOAP [GT80] can be used as the criterion to select scan flip-flops to be controlled by the skewed-load approach. Select M state outputs, where M is determined from the number of flip-flops the scan enable signal can drive without being driven by a strong buffer or buffer tree, that have highest 0 or 1 controllability measure and control the selected M scan flip-flops by the skewed-load approach. The 0 controllability measure of line l, $C_o(l)$, is the minimum number of primary and state inputs to be specified to set line l to a 0 (1). Likewise, the 1 controllability measure of line l, $C_1(l)$, is the minimum number of primary and state inputs to be specified to set line l to a 1. Controllability measures of line l are defined as:

$$C_v(l) = \begin{cases} 1 & \text{if } l \text{ is a primary input} \\ 1 & \text{if } l \text{ is a state input} \\ \min\{C_c(l_a)\} & \text{if } v = c \oplus i \\ \sum_{l_a} C_c(l_a) & \text{otherwise} \end{cases} \quad (1)$$

where $l_a$ and l are respectively inputs and outputs of a gate with controlling value c and inversion i. If a value c when applied to an input of a gate, determines the value at the output of the gate regardless of the values applied to its other inputs, then the value is said to be the controlling value of the gate. Note that the controllability measures are calculated on one time frame version of the circuit.

If the skewed-load flip-flops are selected for the disclosed hybrid approach considering only controllability measures of corresponding state outputs, then it may introduce shift dependency untestable faults. If a scan flip-flop drives the fanout cone that its immediate predecessor scan flip-flop also drives, then controlling the scan flip-flop by the skewed-load approach may introduce shift dependency untestable faults. Hence when selecting flip-flops to be controlled by the skewed-load, one should also consider shift dependency relation between adjacent scan flip-flops to avoid introducing shift dependency untestable faults.

If state input $si_i$ drives no fanout cones that its immediate predecessor state input $si_{i-1}$ drives, then $si_i$ is said to be independent and controlling such state inputs $si_i$ by the skewed-load approach does not introduce any shift dependency untestable faults [Sav 92].

When the skewed-load approach is used for all scan flip-flops in the circuit, it is enough to consider only one time frame to identify independent state inputs. However, in the disclosed hybrid approach, some of scan flip-flops are controlled by the broad-side approach.

Hence, in order to guarantee no decrease in fault coverage due to introduction of shift dependency untestable faults, two time frames need to be considered to identify independent state inputs. Nevertheless, it has been found that, decrease in fault coverage due to selecting state inputs that are independent in one time frame but not independent in two time frames to be controlled by the skewed-load approach, is negligible. Since there are very few state inputs that are independent in two time frames, in the experiments whose results are shown subsequently in section IV.E, only one time frame during the independent state input identification analysis is considered in order to select more skewed-load scan flip-flops. FIG. 5 shows a pseudo code for the algorithm to select skewed-load scan flip-flops.

IV.D. Generating Fast Scan Enable Signal

Figure 6:
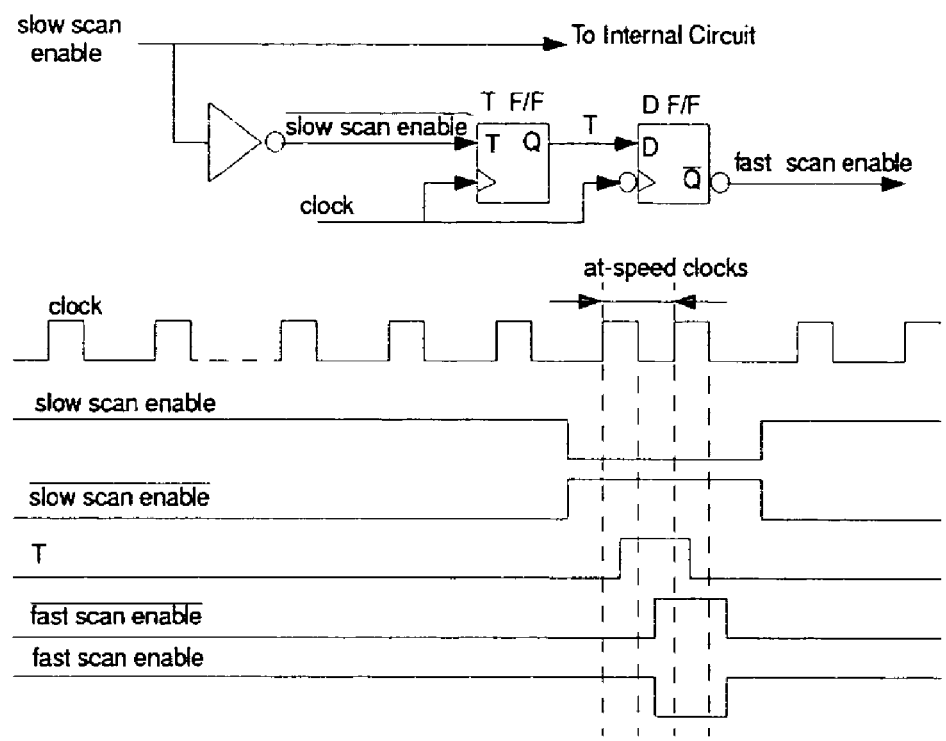
FIG. 6 shows an example of a fast scan enable signal generator.

The fast scan enable signal, which drives skewed-load flip-flops, is internally generated from the slow scan enable signal, which comes from an external pin and drives broad-side flip-flops, and the system clock signal. Hence, no additional external pin is required for the fast scan enable signal. FIG. 6 shows an example schematic for the fast scan enable signal generator and waveforms of involved signals. As the schematic shows, the fast scan enable signal generator can be implemented with very little hardware. Since the fast scan enable signal is synchronized with the system clock, which is accessible from the clock pin of any flip-flop, the fast scan enable signal generator can be located anywhere in the chip to minimize routing from the fast scan enable signal generator to skewed-load flip-flops that are driven by the fast scan enable signal, thereby reducing possible skew problem of the fast scan enable signal and routing overhead in congested chips. Furthermore, since the fast scan enable signal is synchronized, it is also possible to use multiple fast scan enable signal generators and multiple fast scan enable signals, each of which drives different sets of skewed-load flip-flops. When there are many state outputs that have high controllability measures and hence all the scan flip-flops that have high controllability measures cannot be driven by a single fast scan enable signal without a strong buffer, then multiple fast scan enable signals can be used to reduce load capacitance of fast scan enable signals by making each fast scan enable signal drive only a small set of skewed-load scan flip-flops. Since a fast scan enable generator is comprised of only two flip-flops, even hardware overhead of tens of fast scan enable generators will be significantly lower than a clock buffer or buffer tree.

1. Multiple Fast Scan Enable Signals

Some circuits have very small numbers of independent state inputs even if only one time frame is considered for identification of independent state inputs. If such circuits have large numbers of state inputs that have high controllability measures, then reduction in test pattern set sizes and enhancement of fault coverage that are obtained by using the hybrid approach may not be significant. If multiple fast scan enable signals are used, then large reduction in test pattern set sizes and improvement in fault coverage even for such circuits can be realized. If an entire delay test application task is partitioned into several sub-phases and a different subset of scan flop-flops is controlled by fast scan enable signals at each sub-phase, then faults that are not detected due to shift dependency in a sub-phase can be detected in other sub-phases.

Figure 7:
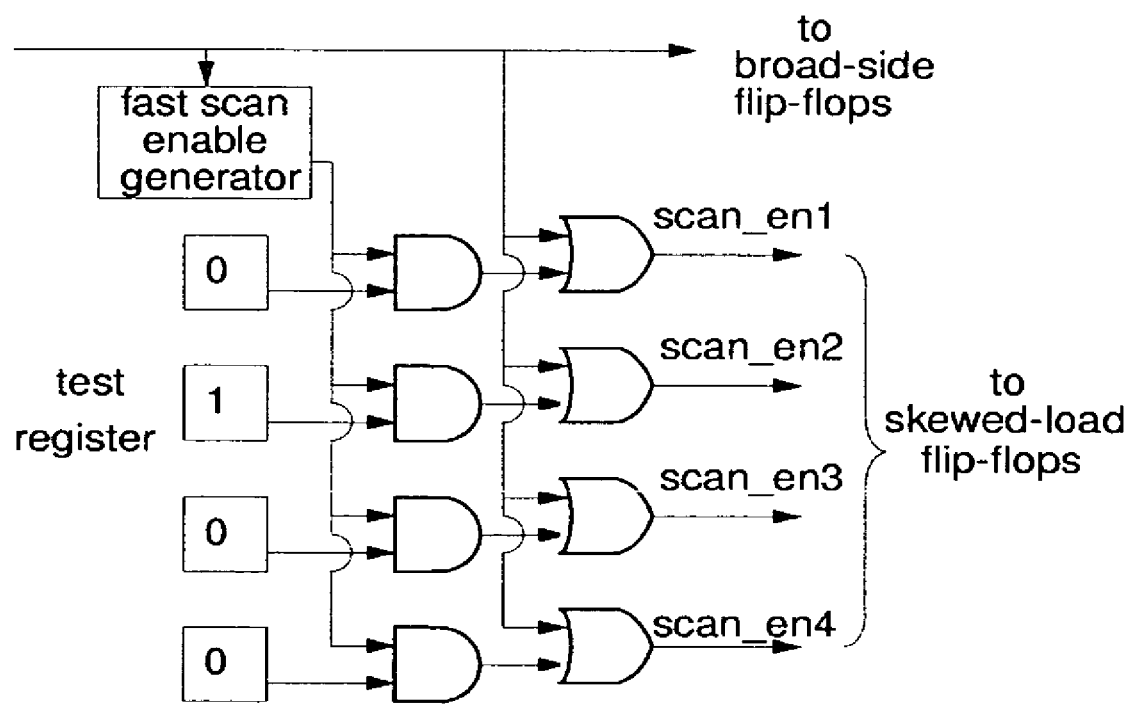
FIG. 7 shows an example of a multiple fast scan enable signal control circuit.

FIG. 7 shows an example of circuit to control multiple fast scan enable signals. The test register is used to control which sets of skewed-load flip-flops are driven by fast scan enable signals. In each sub-phase, the test register will be loaded with different values according to the sets of scan flip-flops that will be controlled by the skewed-load approach. Assume that the test register is loaded with 0100 in sub-phase 1. When the test register is loaded with 0100, only the set of scan flip-flops that are driven by scan_en2 will be controlled by the skewed-load approach and scan flip-flops controlled by other scan enable signals, scan_en1, scan_en3, and scan_en4, will be controlled by the broad-side approach. If scan flip-flops that are driven by scan_en2 drive state inputs that are not independent, then there may exist shift dependency untestable faults that are not detected in sub-phase 1. However, if the test flip-flop that controls scan_en2 is loaded with a 0 in sub-phase 2, then the shift dependency untestable faults that are not detected in sub-phase 1 can be detected in sub-phase 2.

Decrease in fault coverage due to shift dependency can be further minimized by input separation techniques [SP93] and/or scan path test point insertion technique [WC03].

IV.E. EXPERIMENTAL RESULTS

Table 1 shows experimental results for full scan versions of ISCAS 89 benchmark circuits. The experiments were conducted on a SUN Microsystem's Ultra 1 with 1 Giga bytes of memory. The column #FFs shows the number of scan flip-flops in each benchmark circuit. Results obtained by using the skewed-load, the broad-side, and the hybrid approach are compared for transition fault coverage (columns % FC), numbers of test patterns generated (columns #Vec.), and ATPG run time (columns time). Columns under the heading Skewed-load are results for the traditional skewed-load approach, columns under the heading Broad-side are results for the traditional broad-side approach, and columns under the heading Hybrid are results for the disclosed hybrid delay scan approach. Only one fast scan enable signal is used in every benchmark circuit and used M (the maximum number of skewed-load flip-flops) as 10% of total number of scan flip-flops in the circuit. However, only 1 or 2 flip-flops are selected as skewed-load flip-flops for many circuits since those circuits have very small numbers of independent inputs.

For all benchmark circuits, except for s1196 and s1238, fault coverage achieved by test pattern sets generated by our hybrid approach is higher than that achieved by test pattern sets generated by the broad-side approach. For example, for s13207, broad-side transition fault coverage is only 77.74% while the hybrid approach achieves as high as 89.52%. The average fault coverage improvement over all the ISCAS89 benchmark circuits is 4.47%, with the highest improvement of 13.94%. It is notable that the hybrid approach test pattern sets achieve higher fault coverage than the skewed-load approach test pattern sets for s510, s820, s832, and s13207 for which the broad-side approach test pattern sets achieve significantly lower fault coverage. This implies that when carefully designed, the hybrid approach can achieve even higher fault coverage than the skewed-load approach, which requires very high hardware overhead.

For some circuits, the hybrid approach test pattern sets are larger than the broad-side approach test pattern sets. However, for those circuits, the hybrid approach test pattern sets achieve substantially higher fault coverage. For most circuits for which the hybrid and broad-side approach test pattern sets achieve similar fault coverage, hybrid approach test pattern sets are smaller than broad-side test pattern sets. The only exception is s38417 for which the hybrid approach test pattern set attains similar fault coverage to the broad-side approach test pattern set while the hybrid test pattern set for s38417 has about 100 more patterns than the broad-side test pattern set. It is believed that this is due to inaccuracy in controllability measures used as the criterion to select skewed-load flip-flops. Note that the 1 (0) controllability measure at a line reflects the minimum number of inputs to be specified to set the line to a 1 (0). However, due to conflict with other required assignments during test generation processes, setting a line to a binary value by specifying only minimum number of inputs may not be possible. If state output $so_i$ has a very high 1 controllability measure $C_1(so_i)$ but very low 0 controllability measure $C_0(so_i)$, then the corresponding scan flip-flop $D_{fi}$ will likely be selected as a skewed-load flip-flop since the cost of $so_{i1}$, $cost(so_i)$ =$\max\{C_0(so_i), C_1(so_i)\}$, is very high (see FIG. 5). However, if $so_i$ is required to be assigned 0's in most test patterns, selecting scan flip-flop $D_i$ as the skewed-load flip-flop will not help generate compact test pattern sets. The ATPG run time of the hybrid approach is comparable with that of the broad-side approach for most circuits except a few circuits such as s13207, s5378 and s38417. For s13207, the ATPG run time of the hybrid approach is substantially shorter than that of the broad-side approach and for 5378 and s38417, while ATPG run time of the hybrid approach is substantially longer than that of the broad-side approach.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A scan-based method for testing delay faults in a circuit comprising:
   a) controlling a subset of state inputs of the circuit by a skewed-load approach; and
   b) controlling all inputs other than said subset of state inputs by a broad-side approach
wherein steps a and b are performed together in a non-sequential manner.

2. The method of claim 1, wherein the subset of state inputs are those state inputs that require a sufficient number of primary and state inputs to be specified in a previous time frame so that the said state inputs can be set to required binary values in current time frame.

3. The method of claim 1, wherein the subset of state inputs are connected to outputs of scan flip-flops that are controlled by a fast scan enable signal and all state inputs other than said subset of state inputs are controlled by slow scan enable signal.

4. The method of claim 3 wherein only the fast scan enable signal switches at-speed, said at-speed switching being in one system clock cycle, and the slow scan enable signal does not switch at-speed.

5. The method of claim 4, wherein the fast scan enable signal is internally generated by on-chip circuitry.

6. The method of claim 5, wherein the fast scan enable signal is synchronized to the system clock.

7. The method of claim 5, wherein the fast scan enable signal drives the flip-flops corresponding to said subset of state inputs at-speed, without the need for strong buffers or butler trees.

8. The method of claim 5, wherein the selection of said subset of state inputs is performed by considering shift dependency relationship between adjacent flip-flops.

9. The method of claim 1, wherein the subset of state inputs are selected using controllability measures.

10. The method of claim 9, wherein the set of selected scan inputs is further divided into several subsets, each of said subsets is controlled by a respective scan enable signal.

11. The method of claim 10, wherein each scan enable signal is controlled by a flip-flop such that the scan enable signal switches at-speed when the flip-flop is assigned a 1 and switches at slow speed when the corresponding flip-flop is assigned a 0.

12. The method of claim 10, wherein only the scan flip-flops whose scan enable signal switches at-speed are controlled by the skewed-load approach and remaining scan flip-flops are controlled by the broad-side approach.

13. The method of claim 12, wherein faults that are not detected when a subset of scan flip-flops is controlled by the skewed-load approach are detected when the same subset of scan flip-flops is controlled by the broad-side approach.

14. The method of claim 1, wherein in the skewed-load approach, in applying a first and a second pattern for testing the circuit, the second pattern is obtained by shifting in a first pattern through the circuit.

15. The method of claim 1, wherein in the broad-side approach, in applying a first and a second pattern for testing the circuit, the second pattern is obtained from a response obtained by applying the first pattern.

* * * * *

UNITED STATES PATENT AND TRADEMARK OFFICE
CERTIFICATE OF CORRECTION

| | | |
|---|---|---|
| PATENT NO. | : 7,313,743 B2 | Page 1 of 1 |
| APPLICATION NO. | : 10/653959 | |
| DATED | : December 25, 2007 | |
| INVENTOR(S) | : Wang et al. | |

It is certified that error appears in the above-identified patent and that said Letters Patent is hereby corrected as shown below:

Col. 12, Line 52, (claim 7) delete "butler", insert --buffer--

Signed and Sealed this

Thirtieth Day of September, 2008

JON W. DUDAS
*Director of the United States Patent and Trademark Office*